United States Patent
Saran

(10) Patent No.: US 6,189,209 B1
(45) Date of Patent: Feb. 20, 2001

(54) METHOD FOR REDUCING VIA RESISTANCE IN SMALL HIGH ASPECT RATIO HOLES FILLED USING ALUMINUM EXTRUSION

(75) Inventor: Mukul Saran, Richardson, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/179,919

(22) Filed: Oct. 27, 1998

(51) Int. Cl.$^7$ .................................................... H01K 3/10

(52) U.S. Cl. .......................... 29/852; 257/751; 257/773

(58) Field of Search ............................. 29/825; 438/688, 438/644, 637, 680, 653; 257/751

(56) References Cited

U.S. PATENT DOCUMENTS

| | | | |
|---|---|---|---|
| 4,884,123 | * | 11/1989 | Dixit et al. . |
| 5,627,102 | * | 5/1997 | Shinriki et al. . |
| 5,693,561 | * | 12/1997 | Merchant et al. . |
| 5,712,509 | * | 1/1998 | Harada et al. . |
| 5,892,282 | * | 4/1999 | Hong et al. . |
| 5,918,149 | * | 6/1999 | Besser et al. . |
| 5,985,763 | * | 11/1999 | Hong et al. . |

OTHER PUBLICATIONS

"A New Model for Via Failure Mechanism of Stress–Induced Migration Voiding of Al–Plug of Via on Al–Fill Process in Multilevel Interconnect Processes", Matsukawa et al., VMIC Conference, Jun., 1997, pp. 479–484.

"A Novel High Pressure Low–Temperature Aluminum Plug Technology for Sub 0.5μm Contact/Via Geometries", Dixit et al., *IEEE*, 1994, pp. 5.3.1–5.3.4.

"A Simple Sub–0.3μm CMOS Technology with Five–Level Interconnect using Al–plug and HSQ of Low–k for High Performance Processor" Yoshiyama et al., 1997 Symposium on VLSI Technology Digest of Technical Papers, p. 55–56.

"Filling Contacts and Vias: A Progress Report", Semiconductor International, Feb., 1996, p. 89–94.

"High Pressure Aluminum Via–Fill for ULSI Interconnect using a Liquid Transducer" Jongste et al., Advanced Metallization and Interconnect Systems for ULSI Applications, 1996, p. 1–6.

"High Pressure Aluminum for Sub–Micron Vias Using a Liquid Transducer", Jongste et al. *MicroElectronic Engineering*, vol. 37–38, Nov. 1997 p. 310–327.

"Low Cost high Reliable Metalization Technology Using High Pressure Low Temperature AL Plug", Hamamoto et al., *Advanced Metallization & Interconnect systems for ULSI Applications*, 1995.

* cited by examiner

*Primary Examiner*—Carl J. Arbes
(74) *Attorney, Agent, or Firm*—Wade James Brady, III; Frederick J. Telecky, Jr.

(57) ABSTRACT

A method of forming an electrical interconnect through a via to electrically couple two electrically conductive layers and the device. There are provided a pair of electrically conductive layers and an electrically insulating layer between the pair of electrically conductive layers having a via extending between the pair of electrically conductive layers. A layer of titanium is formed covering the walls of the via and extending onto one of the pair of electrically conductive layers. A thin layer of titanium nitride with a poor step ?? technique is formed covering the titanium on the walls but not covering the titanium on the one of the pair of electrically conductive layers. The remainder of the via is filled with aluminum. The layer of titanium and the layer of titanium nitride preferably extend out of the via and between the electrically insulating layer and at least one of the pair of electrically conductive layers. The aluminum is substantially everywhere spaced from the portion of the layer of titanium covering the walls of the via. The filling of the remainder of the via with aluminum can include deposition of aluminum in the via, heating the aluminum to a temperature at which it is plastically deformable and applying pressure to the aluminum to cause the aluminum to substantially fill voids within the aluminum.

12 Claims, 1 Drawing Sheet

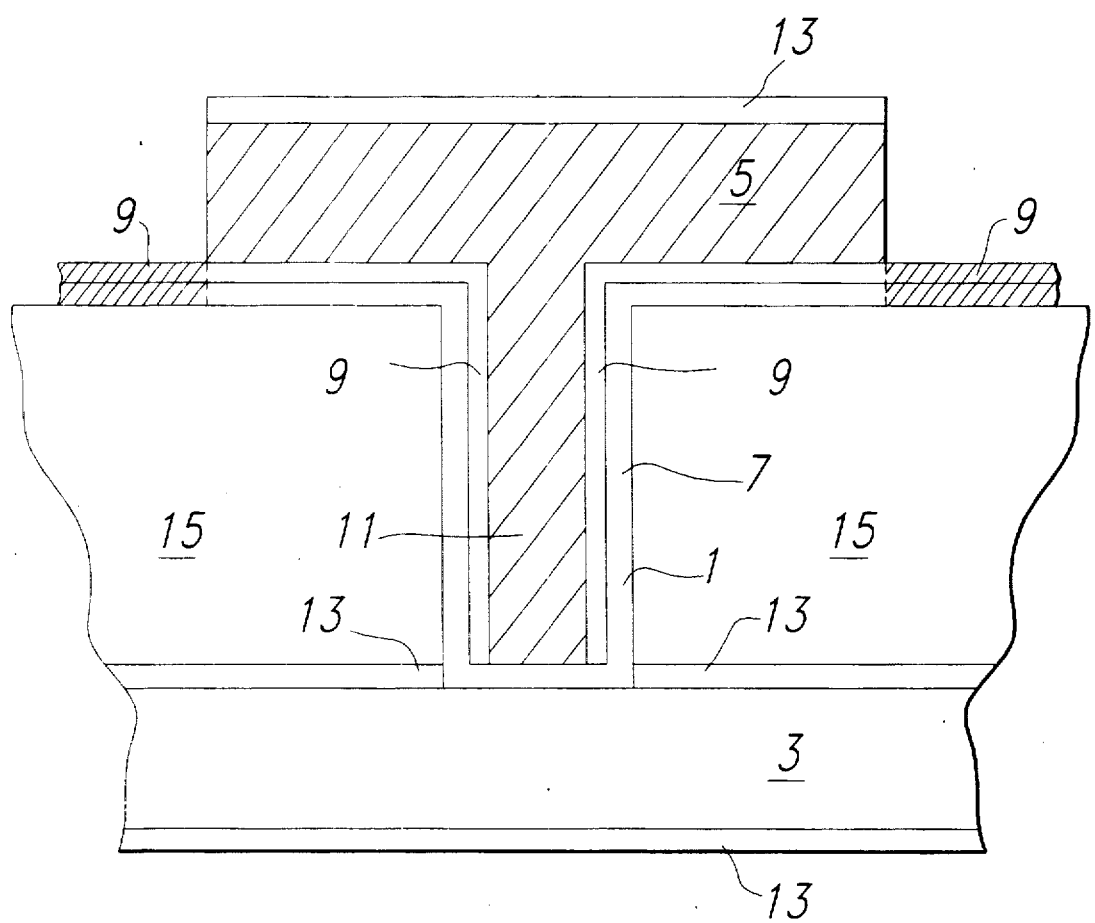

METHOD FOR REDUCING VIA RESISTANCE IN SMALL HIGH ASPECT RATIO HOLES FILLED USING ALUMINUM EXTRUSION

BACKGROUND OF THE INVENTION

1. Field of the Invention

This invention relates to a method of forming electrical interconnections which reduce the resistance of electrical conductive vias of semiconductor devices.

2. Brief Description of the Prior Art

The geometry of semiconductor device components is continually being reduced in size. In order to conserve space on the chip so that the number of components that can be placed upon a chip of given area can be increased, it has been necessary, among other factors, to decrease the diameters of vias formed in the semiconductor device which are used, for example, to interconnect plural different levels of metallization on the chip. In the fabrication of these smaller semiconductor devices and due to the decrease in via geometry and decrease in contact area therein, the electrical resistance through the vias has increased sufficiently to become a major concern. The industry has therefore sought to reduce the electrical resistance through the vias.

One prior art method of filling the vias has generally been to provide an electrically conductive metal, generally tungsten, in the via with a layer of aluminum at both mouths of the via making electrical interconnection between the tungsten in the via and the levels of metallization which were being interconnected. The tungsten, which has relatively high resistivity, is generally separated from the underlying metal layer and the titanium-containing via sidewalls by a layer of titanium nitride. As the via cross-section area is scaled down, the resistance of the via continually increases if the same material, e.g., tungsten, is used to fill the vias. Therefore, another prior art method uses aluminum to fill the vias utilizing the lower resistivity of the aluminum to advantage. The techniques used for filling the vias with aluminum have included high temperature aluminum reflow, high pressure extrusion of aluminum and a combination of chemical vapor deposited (CVD) and physical vapor deposited (PVD) aluminum. All of these techniques require the use of titanium and titanium nitride liner layers in the vias. The titanium layer is present in the via so as to alloy the via bottom interface and minimize variability of the via resistance. The titanium nitride layer often is required in the via to separate the titanium liner from the aluminum deposited thereover to prevent intermetallic reaction. There are additional specific reasons to use the titanium nitride layers, depending upon the technique used to form the aluminum plugs in the vias.

The titanium layer is deposited using collimated sputtering to improve coverage of titanium at the base of the small vias. Either ionized metal PVD (IMP) or longthrow techniques are used to improve the titanium nitride liner coverage. In the case of aluminum deposition by CVD and PVD, for example, the titanium nitride layer is required for proper nucleation along the sidewalls of the via. In the case of extruded aluminum, a liner layer is required to ease the flow of aluminum into the via holes. High pressure extrusion of aluminum has, thus far, been carried out with a high step coverage titanium nitride liner layer deposited using a long-throw chamber. Combined CVD/PVD aluminum technique has also utilized high step coverage titanium nitride liner layers deposited using such techniques as IMP or CVD. Step coverage is defined at the thickness of the titanium nitride layer at the bottom of the via divided by the titanium nitride layer thickness over the field regions (the surface from which the via extends).

The above prior art schemes have three metallic interfaces in the path of the current flow, it having been determined as a part of the present invention that each interface adds materially to the the electrical resistance through the via.

SUMMARY OF THE INVENTION

In accordance with the present invention, the above noted problems of the prior art is minimized. There is provided, for example, for a via with a diameter of 0.45 μm and depth of about 1.1 μm filled with aluminum using the high pressure extrusion technique, a reduction in resistance in excess of 30 percent. This is accomplished by the use in the via of a high coverage titanium layer over which is a poor coverage deposition of a titanium nitride separator layer which, in conjunction with extruded aluminum, achieves a low via resistance wherein the low step coverage of titanium nitride covers the walls of the via to the exclusion of the via bottom to the greatest extent possible and separates the aluminum from the titanium at all locations except the via bottom. The poor step coverage at the bottom of the via in accordance with the present invention is defined as less than about 10 percent, it being understood that the titanium nitride coverage at the bottom of the via is preferably zero though, generally, about 5 percent coverage is the best obtainable at present. The step coverage at the bottom of the via is the main concern with the amount of sidewall coverage being less important.

As stated above, it has been determined that a large portion of the electrical resistance observed in the aluminum-containing via occurs at the interfaces of the different metals therein which occur in the direction of current flow. Accordingly, utilization of materials that display lower electrical resistance as well as elimination of as many metallic interfaces as possible in the direction of current flow within the via provides a material decrease in the electrical resistance through the via. This is especially true in the case of vias filled with aluminum plugs since the aluminum plug material within the via is less than one third as resistive as tungsten. Thus, the interface resistance becomes a larger fraction of the total resistance.

In order to achieve the goal of decreased electrical resistance through a via contained in an electrically insulating layer, there is provided a high coverage thin layer of titanium on the walls and bottom of the via over the lower metal layer and between the electrically insulating layer and the upper metal layer and the electrically insulating layer and the lower metal layer. The thickness of the titanium layer is limited by the total thickness available for the Ti/TiN/Al stack. The thickness of aluminum required is set to meet the sheet resistance specifications and/or, in case of high pressure extrusion, for adequately sealing the aluminum over the via prior to extrusion for proper via fill and generally is in the range of about 200 A to about 1000 A, preferably about 500 A. A low step-coverage deposition of a layer of one of titanium nitride, tantalum nitride or titanium tungsten, with titanium nitride being preferred, is formed on the sidewalls of the via and over the titanium film. The low step coverage of deposition, preferably titanium nitride, covers the walls of the via and the titanium external to the via where the titanium would otherwise contact the upper or lower metal layer and to the exclusion of the via bottom to the greatest extent possible. The aluminum is then applied to fill the void and contact the lower metal layer directly. An example of formation of the aluminum plug in the via is with use of a high pressure extrusion process commercialized by Trikon Corporation. The aluminum is sputtered into the via to make contact with the titanium at the via bottom and with the titanium nitride on the via walls. The sputtered aluminum will not completely fill the via due to small via sizes and inability of sputter techniques to fill the vias. Subsequently, the sputtered aluminum is subjected to high pressure (with or without a capping layer of an anti-reflective coating) with sufficient heat to soften the aluminum so that it will plastically deform under the pressure applied to remove the pockets and thereby fill the via without actual melting (from about 400° C. to about 450° C.) The applied pressure required is generally in excess of about 400 atmospheres and preferably about 700 atmospheres, it being understood that a pressure sufficient to cause the aluminum to flow and fill substantially all voids or pockets therein is required. The extrusion can be carried out prior to or after coating the aluminum film with an anti-reflecting coating (ARC) layer, usually titanium nitride (but other ARC materials can also be used). Extrusion after ARC deposition is preferred and has the advantage that it also eliminates post-extrusion aluminum surface splitting observed over dense via arrays.

The above described procedure differs from the prior art approach of using a dual layer, high step coverage Ti/TiN liner under the sputtered aluminum. An improvement provided in accordance with the present invention is that the Ti/TiN combination (where TiN is low step coverage) is applied with an extruded aluminum plug. In a typical 0.46 micrometer via (aspect ratio about 2:1), titanium nitride thickness at the bottom of the via may be about 20 percent for a high coverage film and about 5 to about 10 percent for a "poor" or low coverage film. The benefit of removing the titanium nitride interface at the bottom of the via is demonstrated by the reduction in via resistance from 0.99 ohms to 0.61 ohms when aluminum plugs were formed using high pressure extrusion on a titanium liner (without any titanium nitride liner).

Although elimination of the titanium nitride liner produces similar lower via resistance, it should be understood that, when using only a titanium liner without the titanium nitride, it suffers from the disadvantage that titanium and aluminum in close contact react under high temperatures to result in a large increase in the sheet resistance of the metal leads. The solution for low via resistance when the via will later be subjected to high temperatures, in the range of from about 250 to about 450 degrees C., is to incorporate a thin (100 to 200 A) separator layer of titanium nitride between the titanium liner and the aluminum on the walls of the via and between the titanium and the upper metal layer, but not at the bottom of the via. The titanium nitride deposition can use any technique which provides a very poor step coverage within the vias such as, for example, sputter deposition. Step coverage is defined as the ratio of the titanium nitride thickness at the bottom of the via relative to the titanium nitride thickness over the field regions (surface defining the via and from which the via extends). Thus, in the lead areas, titanium and aluminum intermixing is prevented while allowing alloying of titanium and aluminum within the via at the via bottom, resulting in elimination of an interface at the via bottom.

BRIEF DESCRIPTION OF THE DRAWINGS

The FIGURE is a cross sectional view of a via with interconnect therein in accordance with the present invention.

DESCRIPTION OF THE PREFERRED EMBODIMENT

With reference to the FIGURE, there is shown an interconnection between a metal layer 3 and a metal layer 5 separated by a dielectric 15 with the interconnection being provided within a via 1 extending through the dielectric. A layer of titanium 7 covers the upper surface of the dielectric 15 as well as the walls and bottom of the via. A layer of titanium nitride 9 covers the layer of titanium on the upper surface of the dielectric 15 and the sidewalls of the via 1 but not the bottom of the via. A layer of titanium nitride 13 also covers the exposed surfaces of the metal layers 3 and 5.

The titanium film 7 is deposited to provide a good bottom coverage (e.g. >15 to 20 angstroms for films of thickness about 500 angstroms) using either a PVD technique (long-throw sputtering, collimated sputtering, ionized metal PVD or the like) or a CVD technique. The requirement of the bottom coverage is determined by the amount of titanium required to form a co-alloyed interface with aluminum, and is typically set by measuring the via resistance distributions over several vias or via chains. The titanium nitride liner 13 deposited over the titanium 7 is preferred to have a low bottom coverage (<10% for 500 angstrom thick films, for example). The intent is to not have any titanium nitride (ideally) at the bottom of the via, while still providing enough titanium nitride (less than or equal to 25 angtroms) along the sidewalls in order to prevent interaction between the aluminum plug material 11 and the titanium liner layer 7 under the titanium nitride layer 13. A conventional sputtering technique (without using long-throw, collimation or ionized metal PVD) is ideally suited for this purpose. The step coverage can be deliberately degraded both for the conventional sputtering as well as for collimated and ionized PVD methods by suitably altering the deposition parameters such as deposition temperature, gas pressure, substrate bias, target geometries and coil power.

The aluminum plug 11 extends from the metal layer 3 to the metal layer 5 to provide the interconnect.

To fabricate the structure of the FIGURE, in accordance with a first method, initially there is provided the via 1 extending between an upper metal layer 5 and a lower metal layer 3, the layer 5 to be deposited subsequently. A thin layer of titanium 7 having a thickness of 600 A is deposited on the walls of the via. A low step-coverage deposition of a thin layer of titanium nitride 9 having a thickness of from about 100 to about 200 A is formed on the sidewalls of the via and over the titanium film 7 wherein the low step coverage of titanium nitride covers the walls of the via to the exclusion of the via bottom over the lower metal layer 3 to the greatest extent possible. The required thickness of aluminum 11 is then sputtered into the via 1. The sputtered aluminum 11 is subjected to high pressure extrusion after the ARC layer of titanium nitride 13 has been sputtered so that the aluminum plug 11 formed in the via 1 makes contact with the titanium 7 at the via bottom and with the titanium nitride 9 on the via walls to fill the via. High pressure extrusion refers to the use of a high temperature (from about 400 to about 450° C.) in conjunction with a high pressure (>400 atmospheres) to plastically deform the aluminum film deposited over the wafer surface containing via holes, such that aluminum 11 is forced down into those holes to provide electrical contact with the lower metal lead.

Instead of sputtering, the aluminum can be deposited in the via 1 by a combination of CVD and PVD with subsequent pressure at a flow temperature of aluminum provided as in the above embodiment to fill the via with aluminum and cause the aluminum to make contact with and alloy with the titanium at the bottom of the via 1.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of forming an electrical interconnect through a via to electrically couple two electrically conductive layers which comprises the steps of:
   (a) providing a pair of electrically conductive layers;
   (b) providing an electrically insulating layer between said pair of electrically conductive layers having a via having walls, said walls extending between said pair of electrically conductive layers;
   (c) forming a layer of titanium covering the walls of said via and extending onto one of said pair of electrically conductive layers;
   (d) forming a layer of a material taken from the group consisting of titanium nitride, tantalum nitride and titanium tungsten substantially completely covering said titanium on said walls but not completely covering said titanium on said one of said pair of electrically conductive layers;
   (e) filling the remainder of said via with aluminum such that said aluminum contacts said titanium on said one of said pair of electrically conductive layers to form an interface with said titanium; and
   (f) forming an alloy of said aluminum with said titanium on said one of said pair of electrically conductive layers at said interface.

2. The method of claim 1 wherein said layer of titanium and said layer of a material taken from the group consisting of titanium nitride, tantalum nitride and titanium tungsten extend out of said via and between said electrically insulating layer and at least one of said pair of electrically conductive layers.

3. The method of claim 1 wherein said layer of titanium and said layer of a material taken from the group consisting of titanium nitride, tantalum nitride and titanium tungsten extend out of said via and between said electrically insulating layer and both of said electrically conductive layers.

4. The method of claim 1 wherein said aluminum is substantially everywhere spaced from the portion of said layer of titanium covering the walls of said via.

5. The method of claim 2 wherein said aluminum is substantially everywhere spaced from the portion of said layer of titanium covering the walls of said via.

6. The method of claim 3 wherein said aluminum is substantially everywhere spaced from the portion of said layer of titanium covering the walls of said via.

7. The method of claim 1 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

8. The method of claim 2 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

9. The method of claim 3 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

10. The method of claim 4 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

11. The method of claim 5 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

12. The method of claim 6 wherein said step of filling the remainder of said via with aluminum includes the steps of depositing aluminum in said via, heating said aluminum to a temperature at which it is plastically deformable and applying pressure to said aluminum to cause said aluminum to substantially fill voids within said aluminum.

* * * * *